(12) United States Patent
Martinozzi et al.

(10) Patent No.: US 8,391,086 B2
(45) Date of Patent: Mar. 5, 2013

(54) MASK-WRITE APPARATUS FOR A SRAM CELL

(75) Inventors: Giulio Martinozzi, Cologno Monzese (IT); Mauro Pagliato, Bollate (IT)

(73) Assignee: Elpida Memory, Inc., Tokyo (JP)

(*) Notice: Subject to any disclaimer, the term of this patent is extended or adjusted under 35 U.S.C. 154(b) by 184 days.

(21) Appl. No.: 13/040,766

(22) Filed: Mar. 4, 2011

(65) Prior Publication Data

US 2012/0224439 A1 Sep. 6, 2012

(51) Int. Cl.
*G11C 7/00* (2006.01)
(52) U.S. Cl. .............. 365/189.16; 365/120; 365/154; 365/185.08; 365/189.17
(58) Field of Classification Search ............. 365/189.17, 365/120
See application file for complete search history.

(56) References Cited

U.S. PATENT DOCUMENTS

| | | | | | |
|---|---|---|---|---|---|
| 4,811,303 | A | * | 3/1989 | Hirai | 365/185.08 |
| 5,200,600 | A | * | 4/1993 | Shinagawa | 235/492 |
| 6,046,937 | A | * | 4/2000 | Komori et al. | 365/185.04 |
| 6,449,197 | B1 | * | 9/2002 | Hiraki et al. | 365/189.05 |
| 7,861,030 | B2 | * | 12/2010 | Davis | 711/108 |

* cited by examiner

*Primary Examiner* — Tan T. Nguyen
(74) *Attorney, Agent, or Firm* — Morrison & Foerster LLP

(57) ABSTRACT

Disclosed herein is a device that comprises a SRAM cell, a pair of bit-lines coupled with the SRAM cell, a writing circuit producing at first and second output nodes thereof true and complementary data signals responsive to data to be written, a first pass transistor coupled between one of the pair of the bit-lines and the first output node of the writing circuit, a second pass transistor coupled between the other of the pair of bit lines and the second output node of the writing circuit; and a mask-write circuit configured to render both of the first and second pass transistors conductive in a write operation and render selected one or ones of first and second pass transistors non-conductive in a write-mask operation.

20 Claims, 8 Drawing Sheets

| MASK0 | MASK1 | INPUT_DATA | 61 | 62 | 21 | 22 | CURRENT 11 | CURRENT 12 | NEXT 11 | NEXT 12 |
|---|---|---|---|---|---|---|---|---|---|---|
| / | / | 0 | E | E | Li | ML | 0 | 1 | 0 | 1 |
| / | / | 1 | E | E | ML | Li | 0 | 1 | 1 | 0 |
| / | / | 0 | E | E | Li | ML | 1 | 0 | 0 | 1 |
| / | / | 1 | E | E | ML | Li | 1 | 0 | 1 | 0 |
| 1 | 0 | 0 | 0 | E | Hi-Z | ML | 0 | 1 | 0 | 1 |
| 1 | 0 | 1 | 0 | E | Hi-Z | Li | 1 | 0 | 1 | 0 |
| 1 | 0 | 0 | 0 | E | Hi-Z | ML | 1 | 0 | 1 | 0 |
| 1 | 0 | 1 | 0 | E | Hi-Z | Li | 1 | 0 | 1 | 0 |
| 0 | 1 | 0 | E | 0 | Li | Hi-Z | 0 | 1 | 0 | 1 |
| 0 | 1 | 1 | E | 0 | ML | Hi-Z | 0 | 1 | 0 | 1 |
| 0 | 1 | 0 | E | 0 | Li | Hi-Z | 1 | 0 | 0 | 1 |
| 0 | 1 | 1 | E | 0 | ML | Hi-Z | 1 | 0 | 1 | 0 |

Fig.4

| MASK0 | MASK1 | INPUT_DATA | 61 | 62 | 21 | 22 | CURRENT 11 | CURRENT 12 | NEXT 11 | NEXT 12 |
|---|---|---|---|---|---|---|---|---|---|---|
| / | / | 0 | E | E | Li | ML | 0 | 1 | 0 | 1 |
| / | / | 1 | E | E | ML | Li | 0 | 1 | 1 | 0 |
| / | / | 0 | E | E | Li | ML | 1 | 0 | 0 | 1 |
| / | / | 1 | E | E | ML | Li | 1 | 0 | 1 | 0 |
| 1 | 0 | 0 | 0 | 0 | Hi-Z | Hi-Z | 0 | 1 | 0 | 1 |
| 1 | 0 | 1 | 0 | E | Hi-Z | Li | 0 | 1 | 1 | 0 |
| 1 | 0 | 0 | 0 | 0 | Hi-Z | Hi-Z | 1 | 0 | 1 | 0 |
| 1 | 0 | 1 | 0 | E | Hi-Z | Li | 1 | 0 | 1 | 0 |
| 0 | 1 | 0 | E | 0 | Li | Hi-Z | 0 | 1 | 0 | 1 |
| 0 | 1 | 1 | 0 | 0 | Hi-Z | Hi-Z | 0 | 1 | 0 | 1 |
| 0 | 1 | 0 | E | 0 | Li | Hi-Z | 1 | 0 | 0 | 1 |
| 0 | 1 | 1 | 0 | 0 | Hi-Z | Hi-Z | 1 | 0 | 1 | 0 |

MASK-WRITE APPARATUS FOR A SRAM CELL

FIELD OF THE INVENTION

The present invention refers generally to an integrated circuit, and more particularly to a mask-write apparatus for a SRAM cell.

BACKGROUND OF THE INVENTION

It is known in the state of the art that a Flash memory comprises at least a SRAM (Static Random Access Memory) cell. SRAM cells have the advantageous feature of holding data without a need for refreshing. SRAM cells may include different numbers of transistors which form a data latch for storing a bit. Additional transistors may be added to control the access to the transistors of the SRAM cell. SRAM cells are typically arranged as an array having rows and columns. Typically, each row of the SRAM cells is connected to a word-line, which determines whether the current SRAM cell is selected or not. Each column of the SRAM cells is connected with a pair of bit-lines used for storing a bit into, or reading a bit from, the SRAM cell.

A typical SRAM cell configuration is a latch connected by means of two pass transistors with a pair of bit-lines in turn connected with a charging circuit and with an input/output circuit. As shown in FIG. 1, the SRAM cell 1 comprises a pair of cross coupled inverters comprising a first storage node 11 and a second storage node 12 complementary to each another; each inverter comprises preferably (not shown in FIG. 1) a couple of MOS transistors, a PMOS transistor having the source terminal connected to the supply voltage Vcc and the drain terminal connected to the drain terminal of the NMOS transistor having the source terminal connected to ground GND. The SRAM cell 1 has the storage nodes or external terminals 11 and 12 connected with the respective bit-lines 21 and 22 by means of the pass transistors 31 and 32.

A charging circuit 50 provides to charge the bit-lines 21 and 22 and an input/output circuit 60 provides to write or read the SRAM cell; a decoder circuit 70 can be provided between the bit-lines 21 and 22 and the input/output circuit 60. The control gates of both the transistors 31, 32 are connected with a word-line WL. Writing into the cell comprises the unbalancing of the SRAM cell by unbalancing the bit-lines 21, 22. The input/output circuit 60 comprises, a buffer and an inverter and pass transistors 61, 62; when it needs writing a bit "0" in the SRAM cell 1 which stores a bit "1" one between the bit-lines 21, 22 is unbalanced by the circuit 60, that is the circuit 60 controls the bit-lines 21 and 22 to have opposite logic values.

A circuit scheme of the input/output circuit 60 is shown in FIG. 2 together with SRAM cell 1 and the pre-charge circuit 50. It should be noted that the decoder circuit 70 shown in FIG. 1 is omitted from FIG. 2. The circuit 60 includes a buffer 63 that has at the input terminal INPUT_DATA the bit "0" or the bit "1", and the output terminal of the buffer 63 is connected with the bit-line 21 by means of the pass transistor 61 and with the bit-line 22 by means of the series of an inverter 64 and the pass transistor 62. When a bit "0" or a bit "1" is present at the input terminal of the buffer 63 the pass transistors 61 and 62 are enabled; for example when it is necessary to write a bit "0" in the SRAM cell 1 which stores a bit "1", the pass transistors 61, 62 are enabled to unbalance the bit-line 21, 22 so that a bit "1" is present at the bit-line 21 and a bit "1" is present at the bit-line 22, that is the bit-line 21 is forced to the low voltage Li and the bit-line 22 is forced to the high voltage Hi. In this way, with the pass transistors 31, 32 enabled by the word-line WL, the bit "0" may be written into the SRAM cell 1. A new bit "0" or "1" may be written on the SRAM cell 1 only whether said SRAM cell stored currently a bit "1" or a bit "0"; in the other cases the bit currently stored in the SRAM cell will be confirmed.

Since data read and write operations of the above SRAM are well known in the art, the detailed descriptions thereof will be omitted. The SRAM according to the prior art does not, however, support a data write mask function in which data "0" and/or "1" to be written are masked to be released from being written into a selected memory cell.

SUMMARY OF THE INVENTION

According to one aspect of the present invention, a device comprises: a SRAM cell; a pair of bit-lines coupled with the SRAM cell; a writing circuit producing at first and second output nodes thereof true and complementary data signals responsive to data to be written; a first pass transistor coupled between one of the pair of the bit-lines and the first output node of the writing circuit; a second pass transistor coupled between the other of the pair of bit lines and the second output node of the writing circuit; and a mask-write circuit configured to render both of the first and second pass transistors conductive in a data-write operation and render selected one or ones of first and second pass transistors non-conductive in a data write-mask operation.

BRIEF DESCRIPTION OF THE DRAWINGS

The features and advantages of the present invention will become apparent from the following detailed description of some embodiments thereof, illustrated only by way of non-limitative example in the annexed drawings, in which:

FIG. 4 shows the true table of the apparatus in FIG. 3 when a bit "0" or a bit "1" is at the input terminal;

FIG. 6 shows the true table of the apparatus in FIG. 5 with the mask-write device of FIG. 7 when a bit "0" or a bit "1" is at the input;

DETAILED DESCRIPTION OF ILLUSTRATIVE EMBODIMENTS

Figure 1:
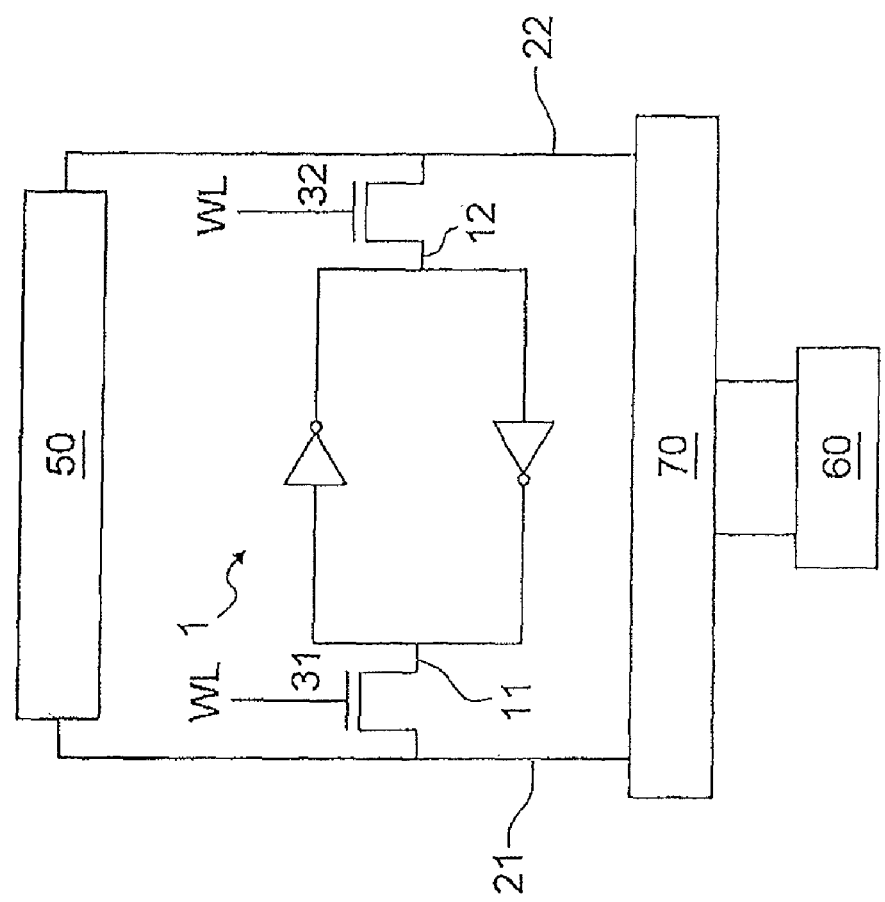
FIG. 1 shows a conventional latch configuration SRAM cell.
Figure 2:
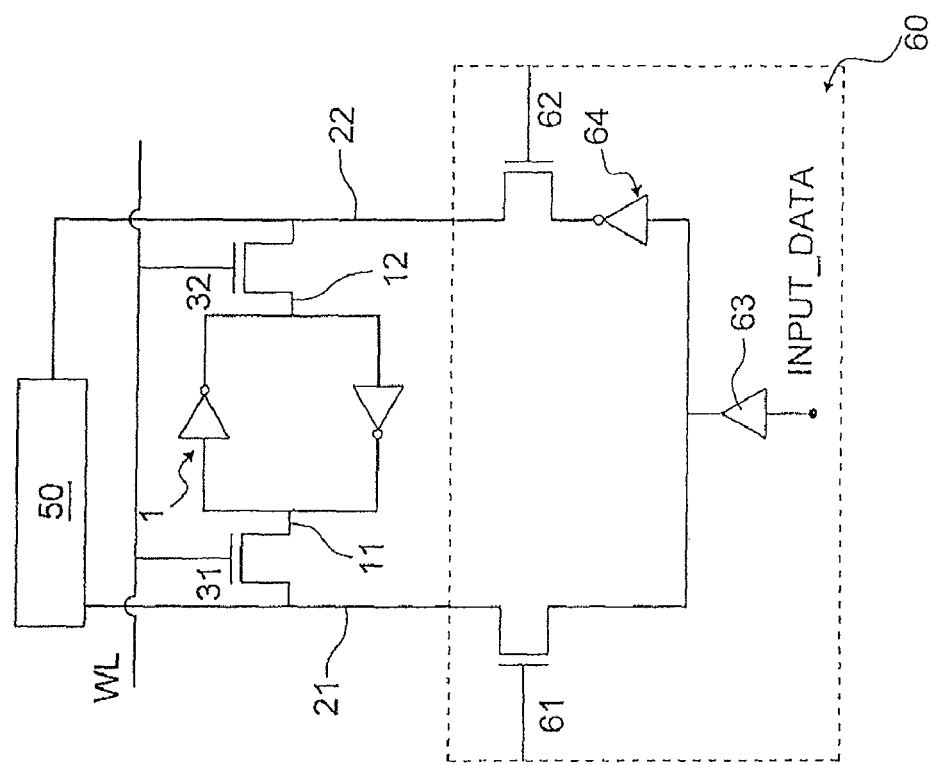
FIG. 2 shows a conventional apparatus for writing the SRAM cell in FIG. 1.
Figure 3:
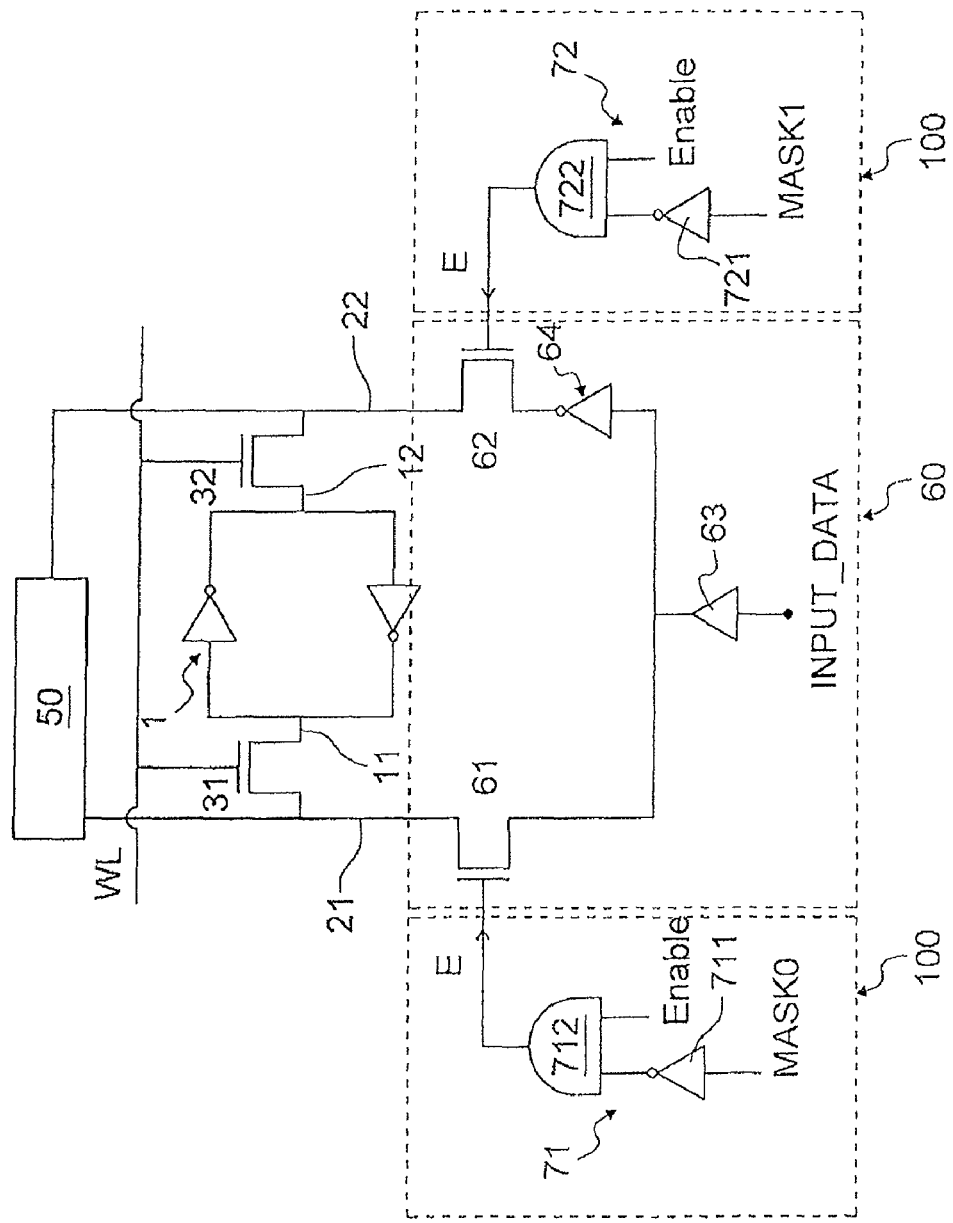
FIG. 3 shows a mask-write apparatus for writing a SRAM cell according to a first embodiment of the invention.

With reference to FIG. 3 an integrated circuit structure comprising a mask-write apparatus for writing a SRAM cell according to a first embodiment of the invention is shown. The integrated circuit structure comprises a SRAM cell 1 having the external terminals 11 and 12 connected with the mask-write apparatus and precisely with the bit-lines 21 and 22 by means of the pass transistors 31 and 32. The SRAM cell comprises a pair of cross coupled inverters comprising a first storage node 11 and a second storage node 12 complementary to each another; each inverter comprises preferably (not shown in FIG. 1) a couple of MOS transistors, a PMOS transistor having the source terminal connected to the supply voltage Vcc and the drain terminal connected to the drain terminal of the NMOS transistor having the source terminal connected to ground GND. The storage nodes of the SRAM cell 1 correspond to the external terminals 11 and 12.

A charging circuit 50 is provided to charge the bit-lines 21 and 22 and an input/output circuit 60 is provided to write or read the SRAM cell. The control gates of both the transistors 31, 32 are connected with a word-line WL. Writing into the cell comprises the unbalancing of the SRAM cell by unbalancing the bit-lines 21, 22, that is by controlling the bit-lines 21 and 22 to have opposite logic values. The input/output circuit 60 includes a buffer 63 that has at the input terminal INPUT_DATA the bit "0" or the bit "1". The output terminal of the buffer 63 is connected with the bit-line 21 by means of the pass transistor 61 and with the bit-line 22 by means of the series of an inverter 64 and the pass transistor 62.

The device shown in FIG. 3 further includes a mask-write apparatus which comprises a mask-write device 100 having a mask signal MASK0, MASK1 at the input terminal and configured to disable one between the pass transistors 61, 62 to prevent the respective writing of a bit "0" or a bit "1" into the SRAM cell 1 when the mask signal MASK0, MASK1 controls respectively to mask the bit "0" or the bit "1". The state of the terminal 11, that is the high voltage or the low voltage, determines the presence of the bit "1" or the bit "0" in the SRAM cell 1.

Preferably the mask-write device 100 comprises the circuit blocks 71, 72 having at the input terminals the signal Enable to enable the transistor 61, 62 and the respective signal MASK0 and MASK1 which allow the device to prevent the writing of the bit "0" or the bit "1" on the SRAM cell 1. The circuit block 71 outputs an enabling signal E for the transistor 61 while the circuit block 72 outputs an enabling signal E for the transistor 62.

The circuit block 71 comprises a NOT gate 711 having at the input the signal MASK0 and the AND gate 712 having at the input the output signal of the NOT 711 and the signal Enable and outputs a signal E when the signal MASK0 is 0 and the Enable signal is 1. The circuit block 72 comprises a NOT gate 721 having at the input the signal MASK1 and the AND gate 722 having at the input the output signal of the NOT 721 and the signal Enable and outputs a signal E when the signal MASK1 is 0 and the Enable signal is 1. In this way one between the pass transistors 61 and 62 is enabled while leaving the other one disabled. In this way the bit-line 21 or the bit-line 22 is not driven by the input data.

FIG. 4 discloses the true table corresponding to the first embodiment mentioned in FIG. 3, and the first to fourth rows correspond to a write operation without any write-mask functions, the fifth to eighth rows correspond to a "0" write-mask operation, and the ninth to twelfth rows correspond to a "1" write-mask operation. As shown in the true table in FIG. 4, whether the input MASK0 is active (indicated by the reference 1), the pass transistor 61 is disabled while the pass transistor 62 is always enabled (reference E); in this way the bit-line 21 is not driven by the input data (indicated by the reference Hi-Z) and the bit-line 22 is placed at low voltage Li or at high voltage ML (wherein ML=Vcc−Vt with Vt threshold voltage of the transistor 61, 62) respectively whether the input data at the terminal INPUT_DATA is a bit "1" or a bit "0". This configuration of all the apparatus in FIG. 3 allows a bit "1" to be written in the SRAM cell 1 wherein a bit "0" is stored. Whether the input MASK1 is active (indicated by the reference 1), the pass transistor 62 is disabled while the pass transistor 61 is always enabled (reference E); in this way the bit-line 22 is not driven by the input data (reference Hi-Z) and the bit-line 21 is placed at low voltage Li or at high voltage ML respectively whether the input data is a bit "0" or a bit "1". This configuration of the all the apparatus in FIG. 3 allows a bit "0" to be written in the SRAM cell 1 wherein a bit "1" is stored.

The writing of a bit "0" into the SRAM cell 1 storing a bit "1", during the MASK1 write, or writing of a bit "1" into the SRAM cell 1 storing a bit "0", during the MASK0 write, is possible because the bit-line placed at low voltage Li can flip the cell by itself.

The not writing of a bit "0" into the SRAM cell 1 storing a bit "1", during the MASK0 write, or not writing of a bit "1" into the SRAM cell 1 storing a bit "0", during the MASK1 write, is possible because the bit-line placed at high voltage ML is not able to flip the cell by itself.

In fact, when a "0" datum is to be written, the inverter 64 places "1" datum at its output, i.e. a voltage equal to Vpwr. The transistor 62 is in a on state, i.e. its gate E is biased at Vpwr voltage. As a consequence, the maximum voltage that could be placed at node 12 is (Vpwr−Vth), where Vth is the threshold voltage of the transistor 62.

When the node 12 contains a "0" datum, i.e. it's at ground voltage, the node 12 is connected to ground via the pulldown nmos of inverter 1. On the other hand, the pass transistor 32 can only pass the (Vpwr−Vth) voltage, that does not suffice to flip the latch (with the latch made by inverters having small size, as it occurs in the real SRAM cells). For example, in the case of the seventh row of FIG. 4, because the pass transistor 32 only passes the (Vpwr−Vth) voltage, the "1" datum stored in the latch does not flip, and in the case of the tenth row of FIG. 7, because the pass transistor 31 only passes the (Vpwr−Vth) voltage, the "0" datum stored in the latch does not flip. This follows from a current balance among the SRAM latch and a path made by transistor 32, transistor 62 and inverter 64.

On the other hand, when a "1" datum must be written, the inverted "0" is well passed by the transistor 62 and 32. With this bias, the latch easily flips, in fact the equivalent resistance of node 12 towards ground (path made by the transistor 32, the transistor 62 and the inverter 64) is less than the resistance towards Vpwr (the on-resistance of active transistor of the latch 1).

This functionality is ensured by under-sizing the PMOS transistors of the SRAM latch with respect to the size of the NMOS transistor 32, 62 and the NMOS transistor of inverter 64. In the true table of FIG. 4 the references CURRENT 11 and CURRENT 12 and the references NEXT 11 and NEXT 12 indicate the state of the terminals 11 and 12 that is the high voltage (indicated by 1) and the low voltage (indicated by 0). In the true table of FIG. 4 the references CURRENT 11 and NEXT 11 indicate the bit stored in the SRAM cell respectively before and later the above mentioned operations.

Figure 5:
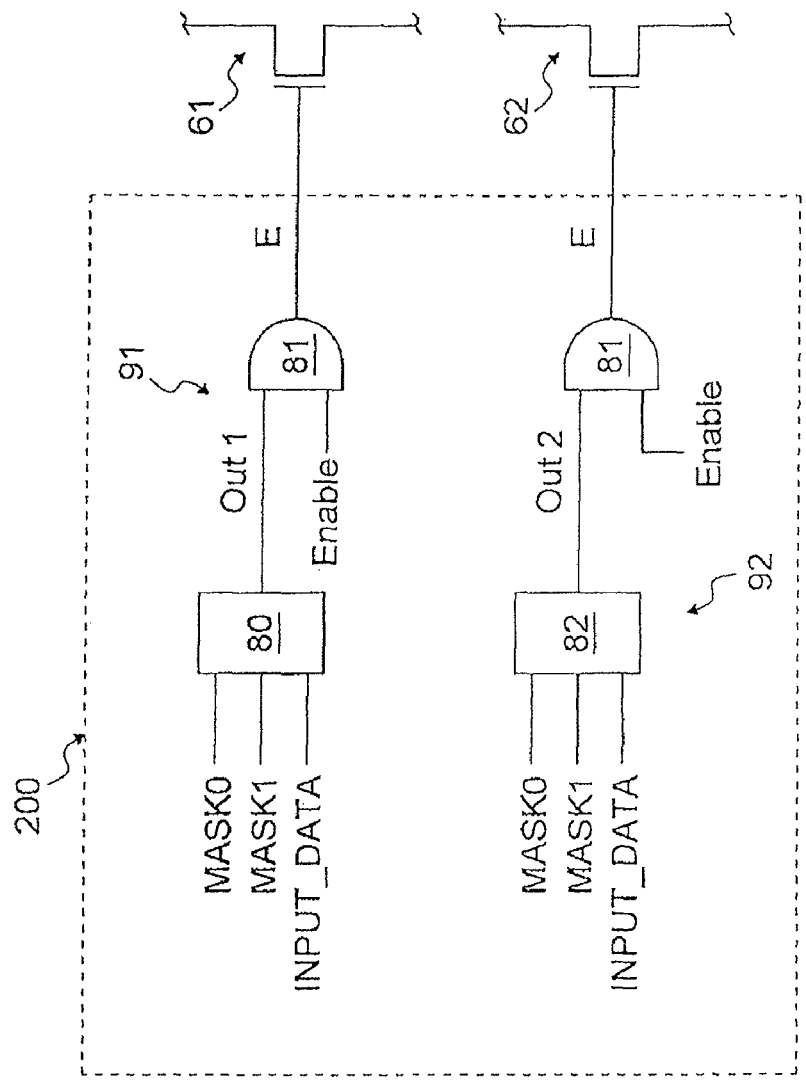
FIG. 5 shows a mask-write device of a mask-write apparatus for writing a SRAM cell according to a second embodiment of the invention.

With reference to FIG. 5 a part of an integrated circuit structure comprising a mask-write apparatus for writing a SRAM cell according to a second embodiment of the invention is shown. In FIG. 5 it is shown the mask-write device 200 to apply at the apparatus in FIG. 3 in the place of the mask-write device 100. The mask-write device 200 of the second embodiment is configured to disable both the pass transistors 61, 62 when the datum masked by means of the mask signal MASK0, MASK1 corresponds to the datum of the data signal INPUT_DATA at the input terminal of the writing device. Therefore one of the pass transistors 61, 62 is always disabled when one between the mask signals is active and the other pass transistor is disabled by the mask-write device 200 even when the datum masked by means of the mask signal MASK0, MASK1 corresponds to the datum of the data signal INPUT_DATA at the input terminal of the writing device.

Preferably the mask-write device 200 comprises the circuit blocks 91, 92, wherein the circuit blocks 91, 92 respectively comprise a logic block 80, 82 having at the input terminals the signals MASK0, INPUT_DATA and MASK1 and an AND gate 81 having at the input terminals the output signal Out1, Out2 of the logic block 80, 82 and the signal Enable; each one of the circuit blocks 91, 92 outputs the signal E for the pass transistor 61, 62.

The logic block 80, when the mask signal MASK1 is active, compares the datum masked by the mask signal MASK1 and the datum at the terminal INPUT_DATA and does not send the signal Out1 only if the datum masked by the mask signal MASK1 corresponds to the datum at the terminal INPUT_DATA with the MASK1 active. The logic block 80 sends the signal Out1 when the datum masked by the mask signal MASK1 does not correspond to the datum at the terminal INPUT_DATA with the MASK1 active. Only with the presence of both the signals Out1 and Enable the pass transistor 61 is enabled.

The logic block 82, when the mask signal MASK0 is active, compares the datum masked by the mask signal MASK0 and the datum at the terminal INPUT_DATA and does not send the signal Out2 only if the datum masked by the mask signal MASK0 corresponds to the datum at the terminal INPUT_DATA with the MASK0 active. The logic block 82 sends the signal Out2 when the datum masked by the mask signal MASK0 does not correspond to the datum at the terminal INPUT_DATA with the MASK0 active. Only with the presence of both the signals Out2 and Enable the pass transistor 62 is enabled.

Therefore when a bit "0" must be written and the signal MASK0 is active and the signal Enable is active the pass transistors 61, 62 are disabled while when a bit "1" must be written and the signal MASK1 is active and the signal Enable is active the pass transistors 62, 61 are disabled; in these cases no write occurs.

FIG. 6 discloses the true table corresponding to the second embodiment mentioned in FIG. 5, and the first to fourth rows correspond to a write operation without any write-mask functions, the fifth to eighth rows correspond to a "0" write-mask operation, and the ninth to twelfth rows correspond to a "1" write-mask operation. As shown in the true table of FIG. 6 whether the input MASK0 is active, the pass transistor 61 is disabled while the pass transistor 62 is enabled (reference E) only whether a bit "1" must be written else the transistor 62 is disabled; in this way the bit-line 21 is not driven by the input data (reference Hi-Z) and the bit-line 22 is not driven by the input data (reference Hi-Z) whether the input data is a bit "0" (reference 0) while is placed at the low voltage Li when the input data is a bit "1" (reference 1).

Whether the input MASK1 is active, the pass transistor 62 is disabled while the pass transistor 61 is enabled (reference E) only whether a bit "0" must be written else the transistor 61 is disabled; in this way the bit-line 22 is not driven by the input data (reference Hi-Z) and the bit-line 21 is not driven by the input data (reference Hi-Z) whether the input data is a bit "1" while is placed at the low voltage Li when the input data is a bit "0".

In the true table of FIG. 6 the references CURRENT 11 and CURRENT 12 and the references NEXT 11 and NEXT 12 indicate the state of the terminals 11 and 12 that is the high voltage (indicated by 1) and the low voltage (indicated by 0). In the true table of FIG. 6 the references CURRENT 11 and NEXT 11 indicate the bit stored in the SRAM cell respectively before and later the above mentioned operations.

The mask-write device of the second embodiment avoids power consumption of the all the apparatus to write a SRAM cell because it removes the contentions which occurs when the data input is driving at high level a bit-line while the corresponding terminal of the SRAM cell is keeping at low level. The SRAM cell comprises a pair of cross coupled inverters comprising a first storage node 11 and a second storage node 12 complementary to each another; each inverter comprises preferably a couple of MOS transistors, a PMOS transistor having the source terminal connected to the supply voltage Vcc and the drain terminal connected to the drain terminal of the NMOS transistor having the source terminal connected to ground GND. A current flows through the writing device, a pass transistor 61, 62, a bit-line 21, 22, one of the transistors 31, 32 and the NMOS transistor of one inverter of the SRAM cell 1, wherein said NMOS transistor of the inverter is turned on and is connected to ground GND. The mask-writing apparatus of the second embodiment of the invention avoids the unwanted power consumption. For example, in the case of the seventh row of FIG. 6, because both of the pass transistor 31 and 32 are disable, the above-mentioned flow of the current is prevented, thereby the unwanted power consumption is avoided, and in the case of the tenth row of FIG. 6, because both of the pass transistor 31 and 32 are disable, the above-mentioned flow of the current is prevented, thereby the unwanted power consumption is avoided therein.

Figure 7:
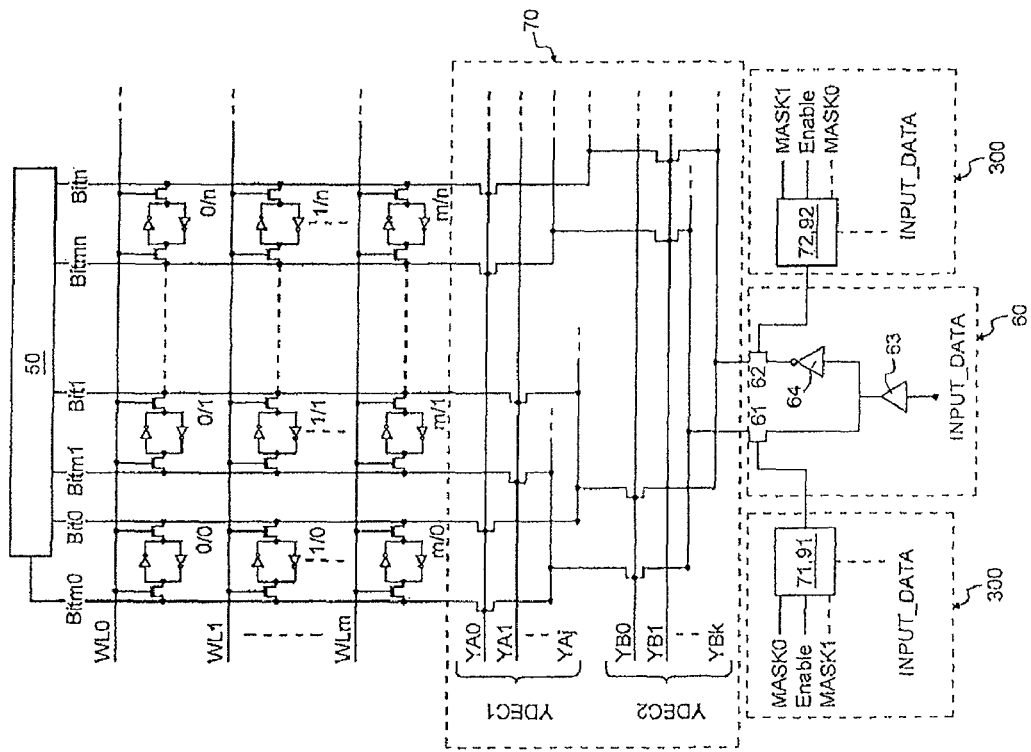
FIG. 7 a mask-write apparatus for writing a SRAM cell according to a third embodiment of the invention.

FIG. 7 discloses an integrated circuit structure comprising a mask-write apparatus for writing a SRAM cell according to a third embodiment of the invention. The integrated circuit structure comprises a plurality of SRAM cells, that is an array of SRAM cells 0/0 . . . 0/n . . . m/0 . . . m/n arranged in rows and columns, a plurality of word lines WL0, . . . WLm, a plurality of pair of bit-lines Bitm0 and Bit0, Bitm1 and Bit1, . . . , and Bitmn and Bitn. Each pair of bit-lines Bitm0 and Bit0, Bitm1 and Bit1, . . . , and Bitmn and Bitn is coupled with one respective column of the array of SRAM cells 0/0 . . . 0/n, 1/0 . . . 1/n, . . . , and m/0 . . . m/n by means of a plurality of first and a second pass transistors controlled by the respective word line WL0 . . . WLm.

The circuit structure comprises a pre-charging circuit 50 coupled with all the pair of bit-lines and configured for charging said pair of bit-lines during a writing operation. The circuit structure comprises a decoder circuit 70 including at least one column decoder, for example two column decoder YDEC1 and YDEC2 with respective decoding signals YA0, YA1 . . . YAj and YB0, YB1 . . . YBk; a column decoder allows only one input/output circuit 60 to control a plurality of bit-lines. A pair of bit-lines is selected when one signal of the column decoder YDEC1 and another signal of the column decoder YDEC2 are at high level, for example for selecting the pair of bit-lines Bitm1 and Bit1 the signals YA1 and YB0 must be at high level and with the word line WL1 at high level the SRAM cell 1/1 is selected.

Each pair of bit-lines Bitm0 and Bit0, Bitm1 and Bit1, . . . , and Bitmn and Bitn is connected with the pass transistors 61, 62 by means of the column decoder YDEC1 and YDEC2. As already disclosed for the first and the second embodiment of the invention, the input/output circuit 60 provides to write each SRAM cell, in this case a SRAM cell of the array of SRAM cells 0/0 . . . 0/n . . . m/0 . . . m/n. Writing into a SRAM cell comprises the unbalancing of the SRAM cell by unbalancing a pair of bit-lines Bitm0 and Bit0, Bitm1 and Bit1, . . . , and Bitmn and Bitn.

The input/output circuit 60 comprises a buffer 63 supplied with input data to be written, an inverter 64, and pass transistors 61, 62. When it needs writing a bit "0" in the SRAM cell 1 which stores a bit "1", one bit-line of the pair of bit-lines Bitm0 and Bit0, Bitm1 and Bit1, . . . , and Bitmn and Bitn is unbalanced by the circuit 60 that includes the buffer 63 connected at its output terminal with a bit-line of the pair of bit-lines Bitm0 and Bit0, Bitm1 and Bit1, . . . , and Bitmn and Bitn by means of the pass transistor 61 and with the other bit-line of the pair of bit-lines Bitm0 and Bit0, Bitm1 and Bit1, . . . , and Bitmn and Bitn by means of the series of an inverter 64 and the pass transistor 62.

The device shown in FIG. 7 further includes a mask-write device 300 that comprises a mask-write device 100. The circuit 100 comprises the blocks 71 and 72 (already disclosed in the first embodiment of the invention and having the respective signals MASK0, Enable and MASK1, Enable at the input terminals of the circuit blocks 71, 72) or the mask-write device 200 comprising the blocks 91, 92 (already disclosed in the second embodiment of the invention and having the addition of the respective signals MASK1, INPUT_DATA, and MASK0, INPUT_DATA indicated in dot lines at the input terminals of the circuit blocks 91, 92), and the mask-write device 300 may be used to control the pass transistors 61, 62.

Figure 8:
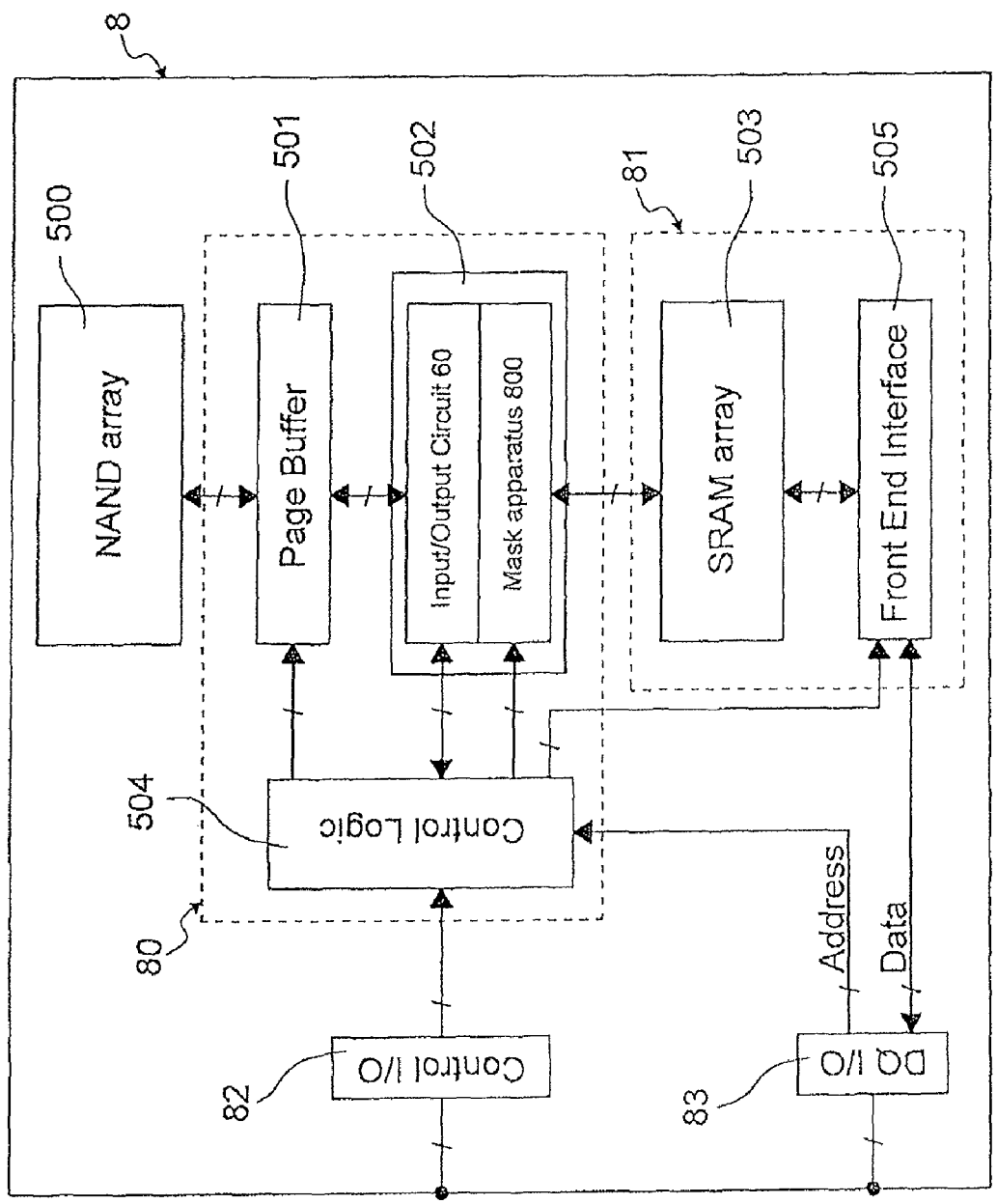
FIG. 8 shows a Flash memory comprising the mask-write apparatus for writing a SRAM cell according to a fourth embodiment of the invention.

Referring now to FIG. 8, there is shown a Flash memory, particularly a NAND Flash memory device 8 as a non-volatile semiconductor memory device, according to a fourth embodiment of the invention. The Flash memory may be classified into a single-level type and a multi-level type. In the single-level type, each memory cell stores information of one bit, whereas each memory cell in the multi-level type stores information of two or more bits. For example, a two-level memory cell stores data "00", "01", "10" or "11", and in accordance with the data to be stored the threshold levels of the memory cell is changed such that the memory cell take one of multiple threshold voltages (three threshold voltages in the two-level memory cell). Therefore, a data read operation usually needs three kind reading-out voltages to detect which one of the threshold levels is actually taken by the accessed memory cell. The Flash memory device 8 according to this embodiment of the present invention is configured to be a two-level type, and an SRAM memory unit with a mask-write function is provided to facilitate the data read operation.

More specifically, the Flash memory device 8 comprises a NAND (non-volatile memory) array 500 including a plurality of non-volatile memory transistors (not shown) connected in a NAND fashion, a control circuit unit 80, an SRAM circuit unit 81. Each of the non-volatile memory transistors may comprise a floating-gate type transistor, a charge-trapping type transistor or the like. The control unit 80 includes a page buffer 501 performing a data transfer with the NAND array 500 and further with a backend interface 502. The control circuit 80 further comprises a control logic 504. The SRAM circuit unit 81 comprises an SRAM array 503 including a plurality of SRAM cells (see FIG. 7), a frontend interface 505. The SRAM array further communicates the backend interface 502. The backend interface 502 comprises the input/output circuit 60 and a mask-write apparatus 800. The mask apparatus 800 and the input/output circuit 60 may be constituted by the circuit blocks 70 and 300 shown in FIG. 7. A control I/O 82 comprises terminal pins to receive signals provided from external of the NAND Flash memory device 8, the received signals being sent to the control logic 504 for controlling the page buffer 501, the backend interface 502 and the backend interface 505. A DQ I/O 83 comprises terminal pins to receives data signals and address signals that are provided from external of the NAND Flash memory device 8, the received data signals being sent to the frontend interface 505 for writing into the SRAM array 503, and the received address signals being sent to the control logic 504 for selecting one or ones of the SRAM cells. The above-mentioned components are fabricated on a single semiconductor chips as a NAND Flash memory device 8.

The control circuit 80 controls transitions of the data between the NAND array 500 and the SRAM array 503. The control logic 504 controls the page buffer 501 to read data from NAND array 500, latch the read data, and deliver the latched data to the input/output circuit 60 of the backend interface 502. The control logic 504 controls the backend interface 502 to receive the delivered data and write the received data to the SRAM array 503 with the write operation without any mask-write functions or with the mask-write operation.

The write-mask operation is performed, in the backend interface, by the control logic 504 responsive to a command indicated by signals given on DQ pins of the DQ I/O 83 and RE#, CLK# and WE# pins of the control I/O 82. The control logic 504 interprets the command thus supplied, and generates each of the mask signals MASK0, MASK1 and the signal Enable, and sends each of the generated signals respectively to, as already disclosed above, each of the components in the mask apparatus 800. As discussed in the embodiment shown in FIG. 5 or 7, the control logic 504 also generates the data signal INPUT_DATA responsive to a bit value that configures data read out from the NAND array and sends the generated data signal INPUT_DATA to the component 200 or 300 in the mask apparatus 800.

Additionally, the control logic 504 controls the frontend interface 505 to receive data supplied via the DQ I/O 83 from external of the flash memory 8 and write the received data to the SRAM array 503, and controls the backend interface 502 to read data from the SRAM array 503 and to deliver the read data to the page buffer 501 for the NAND array 500.

In a NAND Flash memory with the mask-write function is used mainly for an accumulation of results in a SRAM cell of the array 503, that means a logical combination of two data sets, one being already stored in said SRAM cell and the other that coming from the page buffer 501. By setting the MASK0/MASK1 type of transfer from page buffer 501 to the SRAM 503 the control logic 504, which drives the data transfer, makes a logical OR/AND between data in SRAM 503 and data in page buffer 501 and stores the result in the SRAM 503 itself.

As is also mentioned hereinbefore, in the two-level NAND cell storing 2 bits, the 2 bits is code as four values, for example 11, 01, 10, and 00. The four values correspond respectively to different quantity of charge stored in a NAND cell (also correspond respectively to different threshold voltages) and comprise four charge distributions indicated as [11, 01, 10, 00], which are in the order from lower to higher. In the read operation of the four values stored the NAND cell, for example, the low bit "1" and high bit "0" of the charge distribution [10] are read respectively and the low bit "0" and high bit "1" of the charge distribution [01] are read respectively.

The charge distribution [10] is read as follows. Here, it is shown to read the high bit "0" of the value [10]. A first reference (or reading-out) voltage is used, which is a voltage positioned between two charge distribution [01] and [10]. Because the charge distribution [10] is higher than the first reference voltage, the high bit thereof is recognized as "0", which is referred to as "programmed bit". The content "0" of the high bit is transferred via the page buffer 501 from the NAND cell of the NAND array 500 to the input/output circuit 60 and is then written into a certain SRAM cell of the SRAM array 503 with the write operation without any the mask-write function, so that the high bit of the charge distribution [10] can be read as "0".

Next, to read the low bit "1" of the value [10], a second reference (or reading-out) voltage is used, which is a voltage positioned between two charge distributions [11] and [01]. Because the charge distribution [10] is higher than the second reference voltage, the low bit is recognized as "0". The content "0" thereof is transferred via the page buffer 501 from the NAND cell to the input/output circuit 60 and is then written temporally into another SRAM cell that is different from the one already storing the content "0" of the high bit. Then, a third reference (reading-out) voltage is used, which is a voltage positioned between two charge distributions [10] and [00]. Because the charge distribution [10] is lower than the third reference voltage, a low bit is recognized as "1", which is referred to as "erased bits". The content "1" thereof is transferred via the page buffer 501 from the NAND cell to the input/output circuit 60 and is then coming to the SRAM cell storing the content "0" of the low bit. Finally, the "0" write-mask operation, already disclosed above as the one shown at the sixth row of FIG. 4 or 6, is performed between the incoming content "1" and the temporal-stored content "0", thereby the SRAM cell for storing the low bit turns the content "1", so that the low bit of the charge distribution [10] can be read as "1".

As one of the examples, the control logic 504 may recognize to perform the "0" data write-mask operation responsive to reading out the content "0" of the high bit stored in the SRAM cell, thereby control an activation of the mask signal MASK0 and an inactivation of the MASK1, and send each of those controlled mask signals to the mask apparatus 800.

Therefore, the charge distribution can be read as [10] with based on the result of both the low bit "1" and the high bit "0" stored in the SRAM cells.

Also in case of reading the charge distribution [01], the above reading sequences are performed. Differently from the above, however, because the charge distribution [01] is lower than the first reference voltage, the high bit is recognized as "1", which is referred to as "erased bits". The content "1" of the high bit is written into the SRAM cell, so that the high bit of the charge distribution [10] can be read as "0".

Next, it is shown to read the low bit "0" of the value [01]. This is performed as well as the above-explained. Because the charge distribution [01] is higher than the second reference voltage, a first low bit is recognized as "0". The content "0" thereof is written temporally into a SRAM cell of the SRAM array 503. Then, because the charge distribution [10] is lower than the third reference voltage, the low bit is recognized as "1". The content "1" thereof is coming to another SRAM cell that is different from the one already storing the content "1" of the high bit. Finally, differently from the above-explained case of the low bit of the value [10], the "1" write-mask operation, already disclosed above as the one shown at the tenth row of FIG. 4 or 6, is performed between the incoming content "1" and the temporal-stored content "0", thereby the SRAM cell for storing the low bit holds "1", so that the low bit of the charge distribution [01] can be read as "0".

As one of the examples, the control logic 504 may recognize to perform the "1" write-mask operation responsive to reading out the content "1" of the high bit stored from the SRAM cell, thereby control an inactivation of the mask signal MASK0 and an activation of the MASK1, and send each of those controlled mask signals to the mask apparatus 800. The reason why to select the "1" write-mask operation, which is neither the "0" mask operation nor write operation without any write-mask functions, is to avoid the mistaken recognition that means the SRAM cell, which must have turned or have held the bit "0" as the low bit of the value [01], mistakenly turns the bit "1" in the "0" mask-write operation and in the write operation without any write-mask functions.

Therefore, the charge distribution can be read as [01] on the basis of the result of both the low bit "0" and the high bit "1" stored in the SRAM cells.

Additionally, a value made-up by the "0" write-mask operation corresponds to a value made-up by a logical OR operation, and a value made-up by the "1" write-mask operation corresponds to a value made-up by the logical AND operation. It is required to make a logical OR/AND between data in SRAM 503 and data in page buffer 501 and stores the result in the SRAM 503 itself. For example, if a first unit of data is read firstly as [1, 0, 0, 0, 1, 1] and a second unit of data is read secondly as [1, 1, 0, 0, 0, 1], by combining the two reads between the first and second units of data with a logical OR operation, the data [1, 1, 0, 0, 1, 1] is obtained. The result of the combination corresponds to that of the "0" mask-write operation.

Conventional flash multi-level memory needs a complex architecture of page buffer block, with at least two inner latches, for example one is for storing the first-read low bit and the other is for storing the second-read low bit, to combine data inside, while in the present embodiment, the combination is obtained by one latch with the mask-write function and the mask-write operation can be made outside the page buffer.

This is not the only feature allowed by mask-write. A logical combination allows fast data compression techniques used in electrical wafer sort analysis in factory. The wafer sort analysis is a test to find, after performing a program operation on numerous NAND pages to be all programmed (value read 0), if there are some cells that are still erased (value read 1). A conventional procedure requires reading each of the program-performed pages and outputting the data thereof to external in a plurality of times one page by one page to be tested. On the other hand, a procedure of the present invention is a very time consuming operation that is a smart procedure with the feature of mask-write. The procedure allows compression of the data thereof, before being output to external, in the SRAM device with the mask apparatus. By performing the "0" mask-write operation in the procedure, because a datum "1" is not overwritten by a successive incoming datum "0", presence of the datum "1" among the compressed data indicates the performed-program has not been succeeded while presence of all datum "0" thereof indicates it has been succeeded, so that an output of the compressed data can be made in only one time and by one page at the end of the test. Therefore, the procedure of the present invention obtains time reduction of the test compared to the conventional one.

Although the present invention and its advantages have been described in detail, it should be understood that various changes, substitutions and alterations can be made herein without departing from the spirit and the scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, composition of matter, means, methods, or steps.

What is claimed is:

1. A device comprising:
   a SRAM cell;
   a pair of bit-lines coupled with the SRAM cell;
   a writing circuit producing respectively at first and second output nodes thereof true and complementary data signals responsive to data to be written;
   a first pass transistor coupled between one of the pair of the bit-lines and the first output node of the writing circuit;
   a second pass transistor coupled between the other of the pair of bit lines and the second output node of the writing circuit; and
   a mask-write circuit configured to render both of the first and second pass transistors conductive in a write operation and render at least one of first and second pass transistors non-conductive in a mask-write operation.

2. The device according to claim 1, wherein the mask-write operation includes a "0" mask operation in which the data to be written is masked from being written into the SRAM cell when the data to be written is "0" and a "1" mask operation in which the data to be written is masked from being written into the SRAM cell when the data to be written is "1", the first pass transistor being rendered non-conductive and the second pass transistor being rendered conductive when the "0" mask operation is designated, and the first pass transistor being rendered conductive and the second pass transistor being rendered non-conductive when the "1" mask operation is designated.

3. The device according to claim 2, wherein the mask-write circuit comprises:
   a first logic circuit receiving an enable signal and a "0" mask signal and generating an first output signal to be supplied to the first pass transistor; and
   a second logic circuit receiving the enable signal and a "1" mask signal and generating an second output signal to be supplied to the second pass transistor;
   the enable signal being inactivated to set the write operation and activated to set the mask-write operation;
   the "0" mask signal being activated to set the "0" mask operation; and
   the "1" mask signal being activated to set the "1" mask of the mask-write operation.

4. The device according to claim 3, wherein the first output signal is inactivated and the second output signal is activated, when the enable signal and the "0" mask signal are activated and the "1" mask signal is inactivated, so that the first pass transistor is rendered non-conductive and the second pass transistor is rendered conductive, and
   wherein the first output signal is activated and the second output signal is inactivated, when the enable signal and the "1" mask signal are activated and the "0" mask signal is inactivated, so that the first pass transistor is rendered conductive and the second pass transistor is rendered non-conductive.

5. The device according to claim 3, wherein the first logic circuit of the mask-write circuit comprises:
   a first NOT gate receiving the "0" mask signal and
   a first AND gate receiving the enable signal and an output of the first NOT gate and generating an output, as the first output signal included therein, to be supplied to a gate of the first pass transistor;
   and wherein the second logic circuit of the mask-write circuit comprise:
   a second NOT gate receiving the "1" mask signal; and
   a second AND gate receiving the enable signal and an output of the second NOT gate and generating an output, as the second output signal included therein, to be supplied to a gate of the second pass transistor.

6. The device according to claim 1, wherein the mask-write operation includes a "0" mask operation in which the data to be written is masked from being written into the SRAM cell when the data to be written is "0" and a "1" mask operation in which the data to be written is masked from being written into the SRAM cell when the data to be written is "1", both of the first and the second pass transistors being rendered non-conductive when the "0" mask operation is designated and the data to be written is "0", both of the first and second pass transistors being rendered non-conductive when the "1" mask operation is designated and the data to be written is "1", the first and second pass transistors being rendered non-conductive and conductive, respectively, when the "0" mask operation is designated and the data to be written in is "1", and the first and second mass transistors being rendered conductive and non-conductive, respectively when the "1" mask operation is designated and the data to be written is "0".

7. The device according to claim 6, wherein the mask-write circuit comprises:
   a first logic circuit receiving an enable signal, a "0" mask signal, a "1" mask signal and the data to be written and generating an first output signal to be supplied to the first pass transistor; and
   a second logic circuit receiving the enable signal, the "0" mask signal, the "1" mask signal and the data to be written and generating a second output signal to be supplied to the second pass transistor;
   the enable signal being inactivated to set the write operation and activated to set the mask-write operation;
   the "0" mask signal being activated to set the "0" mask operation;
   the "1" mask signal being activated to set the "1" mask operation.

8. The device according to claim 7, wherein both of the first and second output signals are activated, when the enable signal and the "0" mask signal are activated, the "1" mask signal is and the data to be written is "0", or when the enable signal and the "1" mask signal are activated, the "0" mask signal is inactivated, and the input data signal is "1", so that both of the first and second pass transistors are rendered non-conductive.

9. The device according to claim 7, wherein the first output signal is inactivated and the second output signal is activated, when the enable signal and the "0" mask signal are activated, the "1" mask signal is inactivated and the data to be written is "1", so that the first pass transistor is rendered non-conductive and the second pass transistor is rendered conductive, and
   wherein the first output signal is activated and the second output signal is inactivated, when the enable signal and the "1" mask signal are activated, the "0" mask signal is inactivated and the data to be written is inactivated, so that the first pass transistor is rendered conductive and the second pass transistor is rendered non-conductive.

10. The device according to claim 7, wherein the first logic circuit of the mask-write circuit comprises:
    a first logic gate receiving the "0" mask signal, the "1" mask signal and the data to be written; and
    a first AND gate receiving the enable signal and an output of the first logic gate and generating an output, as the first output signal included therein, to be supplied to a gate of the first pass transistor;
    and wherein the second logic circuit the mask-write circuit comprises:
    a second logic gate receiving the "0" mask signal, the "1" mask signal and the data to be written; and a second AND gate receiving the enable signal and an output of the second logic gate and generating an output, as the second output signal included therein, to be supplied to a gate of the first pass transistor.

11. A device comprising:
a non-volatile memory array;
a SRAM array; and
a control circuit unit coupled between the non-volatile memory array and the SRAM array to perform a data transfer therebetween, the data transfer comprising a first write operation in which data read out from the non-volatile memory array is written into the SRAM array without a mask and a second write operation in which data read out from the non-volatile memory array is written into the SRAM array with a mask.

12. The device according to claim 11, wherein the SRAM array includes first and second SRAM cells, and the control circuit unit performs the first write operation to write first data read out from the non-volatile memory array into the first SRAM cell and performs one of the first and second write operations to write second data read out from the non-volatile memory array into the second SRAM cell in response to a content of the first data.

13. The device according to claim 12, wherein the control circuit unit performs the first write operation on the second data when the content of the first data is in a first state and performs the second write operation on the second data when the content of the first data is in a second state.

14. The device according to claim 13,
wherein the SRAM array comprises:
a plurality of pairs of first bit lines: and
a plurality of sets of SRAM cells each set being coupled to an associated one of the pairs of the first bit lines, and
wherein the control circuit comprises:
a writing circuit producing at first and second output nodes thereof true and complementary data signals responsive to data to be written;
a decoder circuit selecting one of the pairs of the first bit lines;
a first pass transistor coupled between one of a selected pair of the pairs of the first bit-lines and the first output node of the writing circuit;
a second pass transistor coupled between the other of the selected pair of the pairs of the first bit lines and the second output node of the writing circuit; and
a mask apparatus configured to render both of the first and second pass transistors conductive in the first write operation and render selected one or ones of first and second pass transistors non-conductive in the second write operation.

15. The device according to claim 14, wherein the non-volatile memory array comprises a plurality of pairs of second bit lines coupled with non-volatile memory cells; and wherein the control circuit comprises a page buffer coupled with the pairs of the second bit lines of the non-volatile memory array.

16. The device according to claim 11, wherein the second write operation comprises a "0" mask operation in which writing a data "0" form the non-volatile memory array into the SRAM array is masked and a "1" mask operation in which writing a data "1" from the non-volatile memory array into the SRAM array is masked.

17. The device according to claim 11, wherein the SRAM array includes first and second SRAM cells, and the control circuit unit performs the first write operation to write first data read out from the non-volatile memory array into the first SRAM cell and performs the first write operation to write second data read out from the non-volatile memory array into the second SRAM cell, the second write operation comprising a "0" mask operation in which a data "0" is masked from being written into the SRAM array and a "1" mask operation in which a data "1" is masked from being written into the SRAM array, one of the "0" mask operation and the "1" mask operation being designated in accordance with the first data and a designated one of the "0" mask operation and the "1" mask operation being performed on third data read out from the non-volatile memory array when the third data is required to be written into the second SRAM cell.

18. The device according to claim 17, wherein a data stored in the second SRAM cell is changed from the second data to the third data when the "0" mask operation is designated and the third data is "1" or when the "1" mask operation is designated and the third data is "0".

19. A method comprising:
producing at first and second output nodes true and complementary signals in response to data to be written; the first and second output nodes being coupled through first and second pass transistors respectively to a pair of the bit-lines between which an SRAM cell is coupled;
producing a mask control signal that takes an active level when a mask-write operation is requested and an inactive level when the mask-write operation is not requested;
rendering selected one or ones of the first and second pass transistors non-conductive in response to the active level of a mask control signal and both of the first and second pass transistors conductive in response to the inactive level of the mask control signal.

20. The method according to claim 19, further comprising reading out data from an NAND array to produce the data to be written.

* * * * *